(12) United States Patent  (10) Patent No.: US 8,787,772 B2
Chen  (45) Date of Patent: Jul. 22, 2014

(54) LASER PACKAGE INCLUDING SEMICONDUCTOR LASER AND MEMORY DEVICE FOR STORING LASER PARAMETERS

(75) Inventor: Chan Chih Chen, Macungie, PA (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 265 days.

(21) Appl. No.: 12/030,499

(22) Filed: Feb. 13, 2008

(65) Prior Publication Data

US 2009/0202256 A1    Aug. 13, 2009

(51) Int. Cl.
*H04B 10/00*   (2013.01)
(52) U.S. Cl.
USPC ............................ 398/182; 398/135; 398/201
(58) Field of Classification Search
USPC .................................................. 398/135–139
See application file for complete search history.

(56) References Cited

U.S. PATENT DOCUMENTS

| | | | |
|---|---|---|---|
| 6,621,580 B2 | 9/2003 | Myatt et al. | |
| 6,788,719 B2 | 9/2004 | Crowder | |
| 6,841,733 B2 * | 1/2005 | Schiaffino et al. | 174/650 |
| 6,922,423 B2 * | 7/2005 | Thornton | 372/38.07 |
| 6,950,450 B2 | 9/2005 | Simsarian et al. | |
| 7,106,976 B2 * | 9/2006 | Ide et al. | 398/182 |
| 7,177,331 B2 | 2/2007 | Yen et al. | |
| 7,440,647 B2 * | 10/2008 | Hosking | 385/14 |
| 7,881,616 B2 * | 2/2011 | Hahin et al. | 398/137 |
| 7,920,788 B2 * | 4/2011 | Nelson et al. | 398/23 |
| 8,019,225 B2 * | 9/2011 | Daghighian et al. | 398/135 |
| 8,170,077 B2 * | 5/2012 | Sedlacik | 372/50.1 |
| 2005/0078916 A1 * | 4/2005 | Hosking | 385/88 |
| 2006/0274796 A1 * | 12/2006 | Cheng et al. | 372/29.021 |
| 2007/0116076 A1 | 5/2007 | Wang et al. | |
| 2007/0242706 A1 | 10/2007 | Dubreuil et al. | |
| 2008/0292311 A1 * | 11/2008 | Daghighian et al. | 398/9 |
| 2009/0028574 A1 * | 1/2009 | Dybsetter et al. | 398/135 |
| 2009/0116845 A1 * | 5/2009 | Li et al. | 398/135 |
| 2009/0202256 A1 * | 8/2009 | Chen | 398/182 |
| 2009/0302881 A1 * | 12/2009 | Sedlacik | 324/767 |
| 2009/0310635 A1 * | 12/2009 | Chen | 372/32 |

FOREIGN PATENT DOCUMENTS

EP       0041668       12/1981
WO   WO2007011558       1/2007

* cited by examiner

*Primary Examiner* — Agustin Bello
(74) *Attorney, Agent, or Firm* — Grossman Tucker Perreault & Pfleger, PLLC

(57) ABSTRACT

A laser package may include a semiconductor laser and a memory device integrated into the laser package for storing parameters associated with the laser. The parameters may include laser manufacturing, operational and/or user parameters. For example, the semiconductor laser may be tunable and the memory device may store tuning parameter data. One example of the laser package is a tunable transmitter optical sub-assembly (TOSA) package.

21 Claims, 4 Drawing Sheets

LASER PACKAGE INCLUDING SEMICONDUCTOR LASER AND MEMORY DEVICE FOR STORING LASER PARAMETERS

TECHNICAL FIELD

The present invention relates to semiconductor lasers and more particularly, relates to a laser package including a semiconductor laser and a memory device for storing parameters associated with the laser.

BACKGROUND INFORMATION

The following descriptions and examples are not admitted to be prior art by virtue of their inclusion within this section.

Wavelength Division Multiplex (WDM) systems use lasers as optical sources for transmitting information. Optical channels may be multiplexed using wavelength division multiplexing, thereby allowing approximately simultaneous transmission of multiple channels of data along an optical fiber. Each optical channel may correspond to an optical wavelength.

There are several types of lasers, including gas lasers, solid-state lasers, liquid (dye) lasers, free electron, and semiconductor lasers. Lasers generally have a laser cavity defined by an optical gain medium in the laser cavity and a method for providing optical feedback. The gain medium amplifies electromagnetic waves (light) in the cavity by stimulated emission, thereby providing optical gain.

In semiconductor lasers, a semiconductor active region serves as the gain medium. Semiconductor lasers may be diode (bipolar) lasers or non-diode, unipolar lasers such as quantum cascade (QC) lasers. Semiconductor lasers are used for a variety of industrial and scientific applications and can be built with a variety of structures and semiconductor materials.

The use of semiconductor lasers for forming a source of optical energy is attractive for a number of reasons. Semiconductor lasers have a relatively small volume and consume a small amount of power as compared to conventional laser devices. Further, semiconductor lasers can be fabricated as monolithic devices, which do not require a combination of a resonant cavity with external mirrors and other structures to generate a coherent output laser beam. For monolithic designs, the optical feedback is typically provided by a reflector or reflectors external and/or adjacent to the optical gain medium or some combination of feedback mechanisms. For example, in Fabry-Perot or Vertical-Cavity Surface-Emitting Laser (VCSEL) lasers a set of mirrors or cleaved facets that bound the optical gain medium may provide the optical feedback. In distributed feedback (DFB) lasers, a distributed reflector along the gain medium may provide the feedback. The distributed reflector may be a Bragg reflector (i.e., Bragg grating). A distributed Bragg reflector (grating) may also be used as an external reflector. In this case, a Bragg grating or gratings may be at or near the ends of the gain medium. A laser with a distributed Bragg reflector as an external reflector is known as a Distributed Bragg Reflector (DBR) laser.

Semiconductor lasers may be configured to emit optical energy at one wavelength or more than one wavelength. A semiconductor laser that is configured to emit optical energy at more than one wavelength may be tunable. In a tunable laser, an emission wavelength may depend on one or more operational parameters.

The particular operational parameters may be laser dependent. A value or a range of values of the operational parameters may be determined when the laser is initially tested and calibrated. It may be desirable to provide the operational parameters in a convenient format for an end-user. This may include providing tables of these parameters in a storage medium such as a removable computer readable disk. Because such a disk may be misplaced, it may be desirable to provide these parameters integrated with a laser package.

BRIEF DESCRIPTION OF THE DRAWINGS

These and other features and advantages will be better understood by reading the following detailed description, taken together with the drawings wherein.

DETAILED DESCRIPTION

Generally, this disclosure describes a laser package including a semiconductor laser and a memory device integrated into the laser package for storing parameters associated with the laser. The parameters may include manufacturing, operational and/or user parameters, as will be described in greater detail below. As used herein, a laser package refers to a combination of a semiconductor laser and one or more other components as a single item that provides an electrical input to the laser and a laser light output. A laser package generally includes a laser package supporting structure, such as a housing, a base, and/or one or more sub-mounts, to support and package the laser with the components.

Examples of laser packages include a transmitter optical sub-assembly (TOSA) package, a butterfly package, a dual inline (DIL) package, and a TO (transistor outline) can package. Other components in a laser package may include, in addition to the memory device, one or more lenses, isolators, photodiodes, thermoelectric coolers, thermistors and the like. A laser package may also include the semiconductor laser and the memory device integrated together as an integrated circuit.

According to one embodiment, the semiconductor laser is tunable and the operational parameters include tuning parameters. As used herein, a tunable laser is capable of emitting optical energy at one or more desired wavelengths. The particular emission wavelength may be determined by one or more of the tuning parameters. The tuning parameters may include current, voltage, and/or temperature and may be specific to each semiconductor laser. The tuning parameters, as well as the other parameters, may be accessible by a user and/or laser drive circuitry, for example, using a serial interface.

Figure 1A:
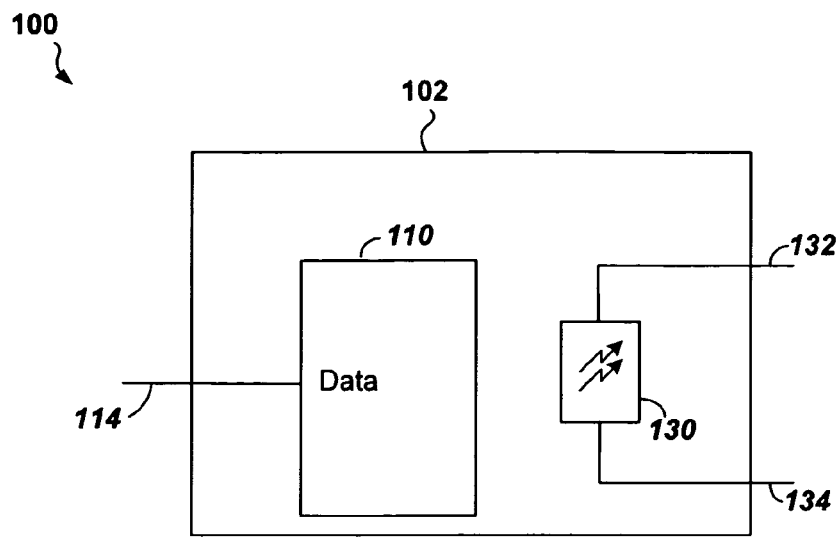
FIG. 1A depicts an illustrative functional block diagram of a laser package with integrated memory.

FIG. 1A depicts a schematic representation of an embodiment of a laser package 100 consistent with the present disclosure. The laser package 100 may include a laser package support structure 102 and a semiconductor laser 130 and a memory device 110 supported by the support structure 102 and located within the laser package region defined by the support structure 102. According to one embodiment, the memory device 110 may be an integrated circuit or memory chip located in the laser package 100. In another embodiment, the memory device 110 and the semiconductor laser 130 may be fabricated together as an integrated circuit forming the laser package 100.

The semiconductor laser 130 receives an electrical input and generates a light output in response to the electrical input. The semiconductor laser 130 may be a laser diode and more specifically may be a DFB or DBR laser. The laser package 100 may include conductive paths that are coupled to the semiconductor laser 130 and extend from the laser package 100 for receiving the electrical input to the laser 130. In the illustrated embodiment, for example, a first laser input path 132 is coupled to the semiconductor laser anode and a second laser input path 134 is coupled to the semiconductor laser cathode. Various types and configurations of conductive paths may be used depending upon the type of laser.

The memory device 110 may be configured to store parameter data representing the parameters associated with the laser 130. The memory device 110 may include nonvolatile memory such as electrically erasable programmable read-only memory (EEPROM) or other types of programmable read only memory. The memory device 110 may also include a read-only portion and a read/write portion. For example, user parameters may be stored in the read/write portion while manufacturing and/or operational parameters may be stored in the read-only portion. Manufacturing and/or operational parameters may be thereby protected from overwriting by a user.

The memory device 110 may be configured for serial communication to store and/or retrieve the parameter data over one or more memory data paths 114 that extend from the laser package 100. The serial communication may be provided using a serial bus interface, such as a one or two line serial interface. According to one embodiment, the serial bus interface is a two line interface that provides serial communications compatible with the I²C protocol, for example, as described in U.S. Pat. No. 4,689,740, incorporated herein by reference. Other serial communication interfaces that may be used include, but are not limited to, a controller area network (CAN) bus, the serial communication interface known as I-Wire, or the Serial Peripheral Interface Bus (SPI). Such serial communication interfaces with relatively few wires or lines may be advantageous given the pin constraints in a laser package.

The parameters associated with the laser 130 may include manufacturing parameters defining manufactured characteristics of the laser, which may be determined and stored in the memory device 110 at the time of manufacturing. Manufacturing parameters may include, for example, emission wavelength, part number, lot number, date of manufacture, and/or operating temperature range.

The parameters associated with the laser 130 may also include operational parameters defining operational characteristics of the laser, which may be determined and stored in the memory device 110 when the semiconductor laser is first tested and calibrated. The operational parameters may define the laser inputs and other operating factors that provide a certain output of the laser and may be unique to each semiconductor laser. Operational parameters may include, for example, light output as a function of drive current and/or threshold current as a function of temperature.

The parameters associated with the laser 130 may further include user parameters defining operational characteristics of the laser that are specific to the environment and/or application in which the laser is used. The user parameters may define the same operational characteristics as the operational parameters but with different values because the environment in which the laser is used may be different than the environment in which the laser is tested and calibrated. The user parameters may be determined and stored in the memory device 110 by a user, for example, when the laser is connected and operated with laser drive circuitry. The user parameters may also include operation parameters that change and are updated over time as the laser ages.

The parameters associated with the laser 130 may further include other parameters known to those skilled in the art. Any data that might be useful to the assembly and operation of the laser may be stored in the memory device 110.

Figure 1B:
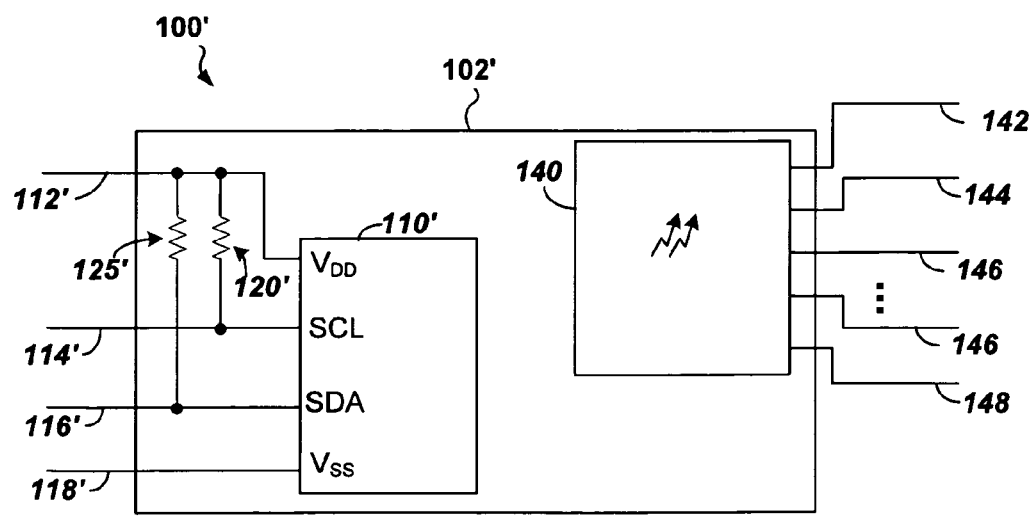
FIG. 1B depicts an illustrative functional block diagram of a tunable laser package with integrated memory.

FIG. 1B depicts another embodiment of a laser package 100' including a tunable semiconductor laser 140. One example of a tunable semiconductor laser 140 is a tunable DBR laser. This embodiment of the laser package 100' includes an integrated memory device 110' similar to the laser package depicted in FIG. 1A and described above. The memory device 110' may be configured to store operational parameters, user parameters and/or manufacturing parameters associated with the tunable semiconductor laser 140.

According to this embodiment, a serial clock (SCL) path 114' and a serial data (SDA) path 116' may be coupled to SCL and SDA ports, respectively, on the memory device 110' to provide serial communications compatible with the I²C protocol. The SCL and SDA paths 114', 116' may be open collector/drain lines and may be coupled to pull-up resistors 120', 125' located either in the laser package 100' or external to the laser package 100'. The laser package 100' may also include supply voltage paths 112', 118' to the memory device 110'.

According to this embodiment, the tunable semiconductor laser 140 may receive multiple electrical inputs to control the tunable light output of the laser and the laser package 100' may include conductive paths to provide the electrical inputs. The conductive paths may include, for example, a signal path 142 for receiving an input signal, a bias path 144 for setting a laser operating point and a ground path 148. The conductive paths may further provide one or more wavelength tuning control paths 146 to provide tuning control inputs to the tunable semiconductor laser 140 for setting and/or selecting a laser emission wavelength. The signal path 142 may be configured to receive a signal with the information and/or data that is to be transmitted, for example, by modulating the laser light output of the laser 140. The bias path 144 may be configured to receive an electrical current and/or an electrical voltage (referenced to the ground connection 148). The bias (or operating) point of the semiconductor laser 140 may be adjusted by adjusting the current and/or voltage applied to the bias path 144.

To control tuning of the laser 140, one of the wavelength tuning control paths 146 may be configured to provide a first current to select a range of emission wavelengths. For example, the first current may adjust a refractive index of a distributed Bragg reflector thereby selecting a range of emission wavelengths. Another one of the wavelength tuning control paths 146 may be configured to provide a second current to select a wavelength from the range of wavelengths selected by the first current. For example, the second current may adjust a phase of feedback from the distributed Bragg reflector. Together, the first current and the second current may provide tunability over a relatively wide range of emission wavelengths.

The number of inputs utilized for laser emission wavelength selection may depend on the particular configuration of the tunable laser. For example, a tunable laser may include more than one phase control section so that the laser emission wavelength may depend on more than one phase current. Accordingly, more than two inputs may be used for selecting laser emission wavelength.

For the tunable semiconductor laser 140, the operational parameters may include tuning parameters obtained from calibration data when the laser is tested and calibrated for different tuned wavelengths. These tuning parameters may be stored in the memory device 110', for example, as a lookup table (LUT) that maps a desired tuned optical output to a particular laser input (or combination of inputs). Other data structures may also be used to store the parameter data. The operational parameters for the tunable semiconductor laser 140 may include, but are not limited to, output light intensity (i.e., gain) and/or slope efficiency as a function of drive current, threshold current as a function of temperature, wavelength as a function of one or more currents (e.g., phase current and/or distributed Bragg reflector current), and wavelength as a function of temperature. The manufacturing parameters and/or operational parameters for a tunable laser may further include other parameters known to those skilled in the art.

For a tunable semiconductor laser 140, user parameters may include updated operational parameters that change over time and may be stored over time. For example, an emission wavelength of a semiconductor laser as a function of current may change over time, i.e., with aging of the laser. Thus, user parameters may include an updated wavelength as a function of one or more currents.

Figure 2:
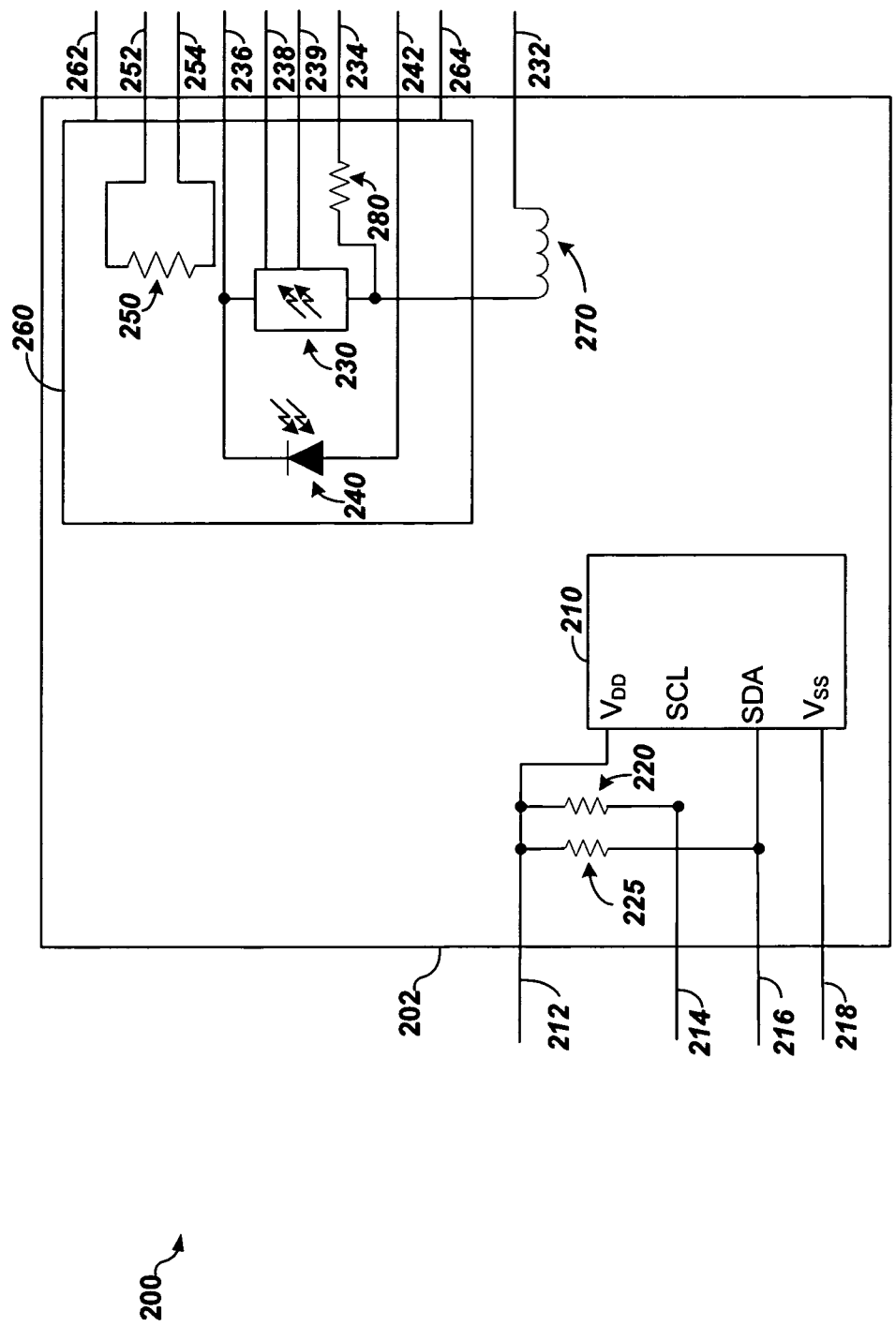
FIG. 2 depicts an illustrative functional block diagram of a transmitter optical sub-assembly (TOSA) package with integrated memory.

Referring to FIG. 2, a tunable transmitter optical sub-assembly (tunable TOSA) package 200 may include a tunable semiconductor laser 230 and a memory device 210 similar to the laser package 100' depicted in FIG. 1B. The tunable TOSA package 200 may include conductive paths to carry signals to and/or from these other components in addition to carrying the input signals to the laser 230 and the data signals to/from the memory device 210.

In an embodiment, the conductive paths may provide a ground path 236 and an RF signal path 234 providing an RF signal input to the semiconductor laser 230. A resistor 280 may be coupled to the RF signal path 234 and the cathode of the tunable semiconductor laser 230. The cathode of the tunable semiconductor laser 230 may be further coupled, through an inductor 270, to a bias path 232.

The tunable TOSA package 200 may also include other components in addition to the laser 230 and memory device 210. In an embodiment, the tunable TOSA 200 may further include a photodetector 240, e.g., a photodiode, for sensing the output of the semiconductor laser 230. The photodetector 240 may be coupled to the ground path 236 and an output monitor path 242. In other embodiments, the tunable TOSA 200 may include a thermistor 250 and a thermoelectric cooler 260. The thermistor 250 and thermoelectric cooler 260 may be configured to detect and/or adjust the temperature of the tunable semiconductor laser 230. The thermistor 250 may be coupled to thermistor paths 252, 254 and the thermoelectric cooler 260 may be coupled to TEC paths 262, 264 extending from the tunable TOSA package 200.

The tunable TOSA package 200 may also include one or more wavelength tuning paths 238, 239 configured to provide one or more tuning inputs to the tunable laser 230, which may be used to select the wavelength of the emitted light, similar to the laser 140 described above. For example, the tuning range input provided over tuning path 238 may be configured to adjust a refractive index of a distributed Bragg reflector thereby selecting a range of emission wavelengths. Tuning wavelength input provided over tuning path 239 may be configured to select a wavelength within the range of wavelengths selected by the tuning range input. For example, the tuning wavelength input provided over the tuning path 239 may be configured to adjust a phase section of the tunable semiconductor laser 230. The emission wavelength may also be adjusted and/or maintained by adjusting the temperature (e.g., using the thermoelectric cooler 260).

Figure 3:
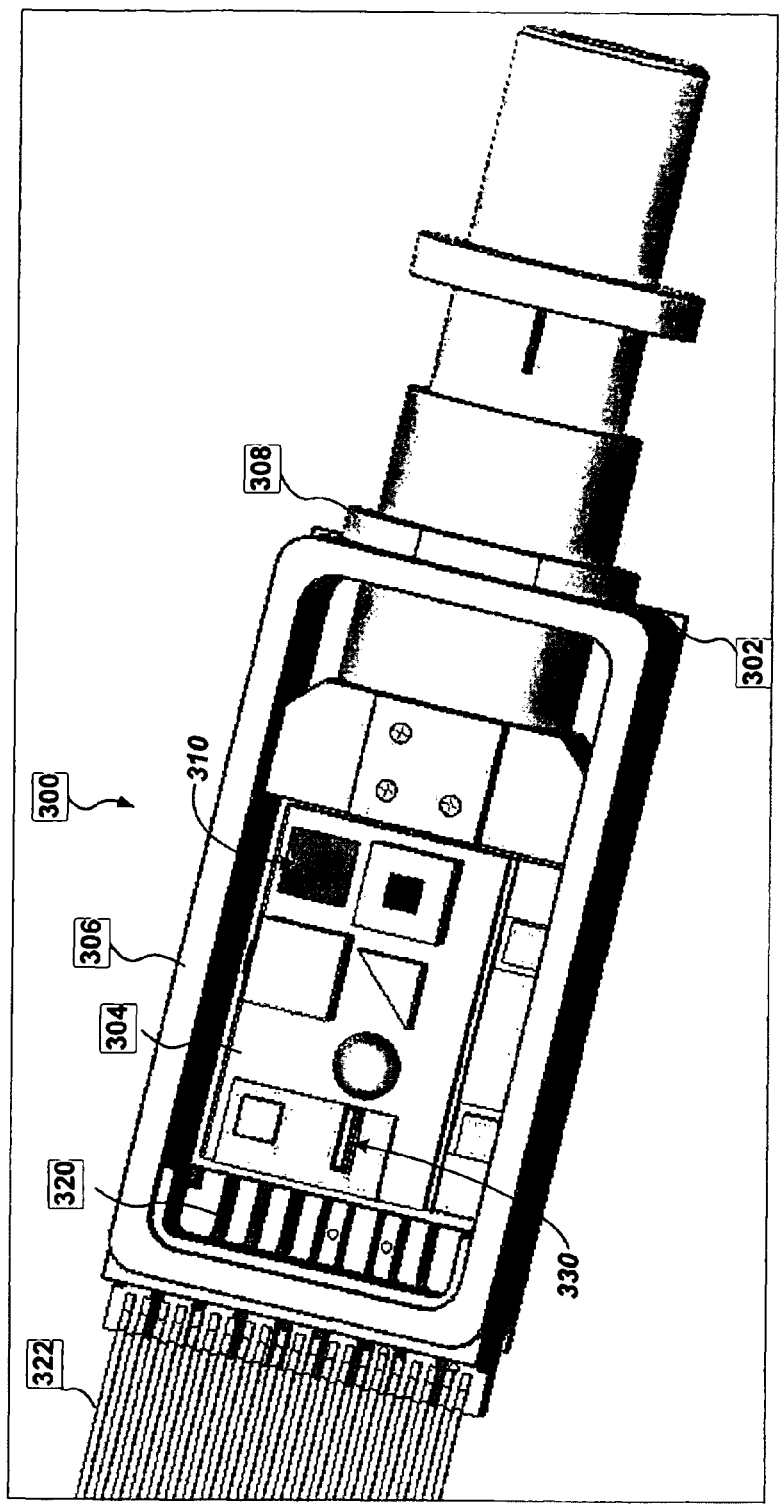
FIG. 3 depicts an illustrative embodiment of a physical layout of a TOSA package with integrated memory.

FIG. 3 depicts a physical layout of an embodiment of a tunable TOSA package 300 with integrated memory. The tunable TOSA package 300 may include a supporting structure formed by a base 302, one or more sub-mounts 304 and a housing 306. A tunable semiconductor laser 330 and a memory device 310 may be mounted within the package 300, for example, on the sub-mount(s) 304. Other optical and/or electronic components known to those skilled in the art may also be mounted within the package 300 (e.g., to sub-mount(s)), such as a photodiode, thermistor, TEC, lens, and isolator. The TOSA package 300 may also include an optical fiber coupling portion 308 that couples an optical fiber (not shown) to the laser package 300 such that the light output from the laser 330 is coupled into the optical fiber.

The TOSA package 300 may include conductive paths 320 extending from the laser 330, memory device 310 and other electronic components in the package 300 to the exterior of the package 300. The sub-mount(s) 304 may include signal traces (not shown), for example, that form at least part of the conductive paths 320. The laser 330, memory device 310 and other electronic components may be mounted to the sub-mount(s) 304 and electrically connected to the signal traces on the sub-mount(s) 304, for example, using wires bonded between the contacts on the component and the traces on the sub-mount(s) 304. At the exterior of the package 300, leads 322 may be coupled to the conductive paths 320. Thus, the parameter data stored on the memory device 310 may be accessed via the leads 322 that are electrically coupled to the conductive paths that carry memory data to/from the memory device 310.

Figure 4:
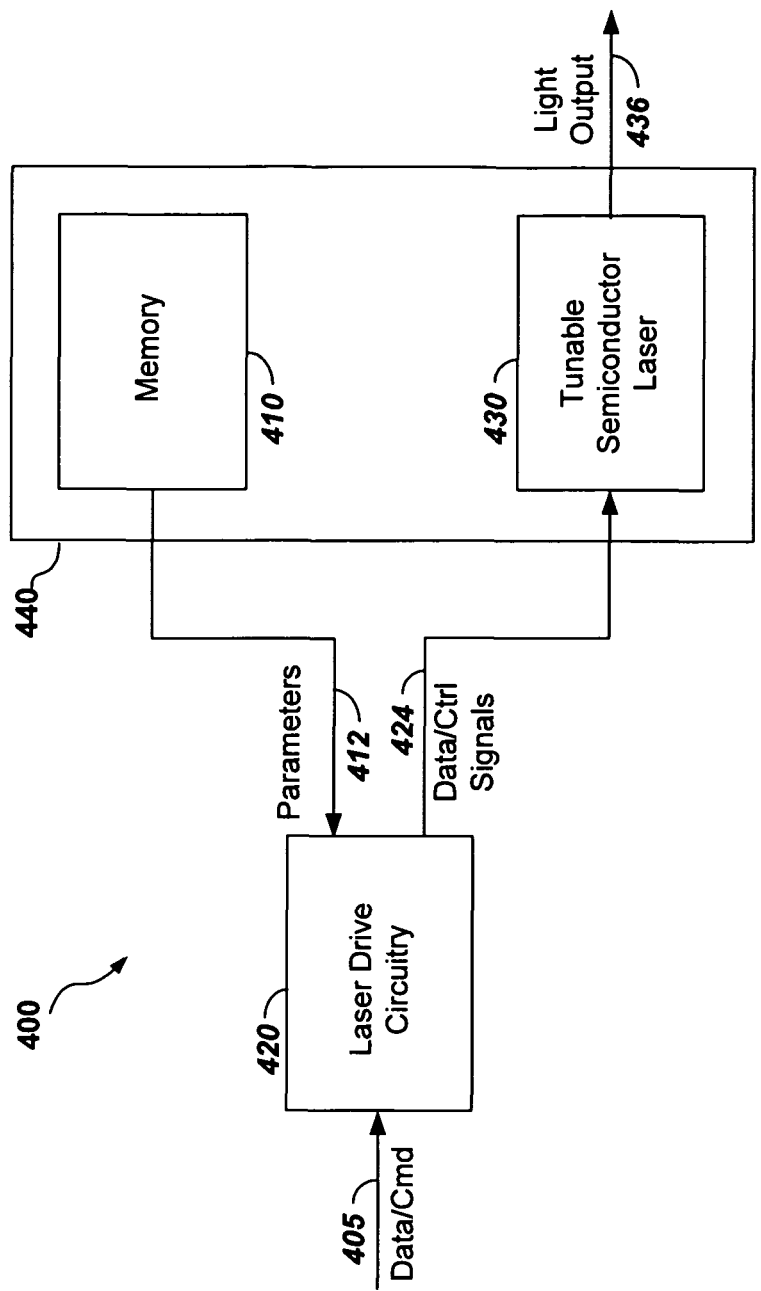
FIG. 4 depicts an illustrative functional block diagram of a laser transmitter including a tunable laser package with integrated memory.

Referring to FIG. 4, a laser transmitter 400 may include laser drive circuitry 420 coupled to a memory device 410 and to a tunable semiconductor laser 430, such as the memory devices and tunable semiconductor lasers described above. In an embodiment, the tunable semiconductor laser 430 and memory device 410 may be packaged within a laser package 440 as described above. This example of the laser transmitter 400 may also include other components, such as an RF amplifier, a thermoelectric cooler (TEC), a microcontroller, a pre-distortion circuit, and/or a clipping correction circuit, as well as other components known to those skilled in the art for use in a laser transmitter.

The laser drive circuitry 420 may be configured to communicate with at least memory device 410, for example, using a serial communication interface. The laser drive circuitry 420 may be further configured to receive data and/or commands 405. The laser drive circuitry 420 may communicate with the memory device 410 and/or provide one or more signals 424 to the tunable semiconductor laser 430 based on this data and/or commands 405. The laser drive circuitry 420 may be configured to read operational and/or manufacturing parameters from the memory device 410 and/or may be configured to read user parameters from, and/or write user parameters to, the memory device 410. The laser drive circuitry 420 may be further configured to provide one or more signals 424 to the tunable semiconductor laser 430, based on the parameters 412 read from the memory device 410. The tunable semiconductor laser 430 may then emit light 436 based on the signals 424 received from the laser drive circuit 420.

For example, the laser drive circuitry 420 may receive operational parameters 412 corresponding to gain, threshold and/or wavelength selection currents. The laser drive circuitry 420 may then provide the appropriate gain, threshold and/or wavelength selection currents to the tunable semiconductor laser 430. The tunable semiconductor laser 430 may then emit light 436 at the appropriate selected intensity and wavelength. The memory device 410 may thereby provide convenient and continuous access to the tunable semiconductor laser 430 operational parameters.

Accordingly, embodiments of the laser package with integrated memory may provide convenient and continuous access to manufacturing, operational, and/or user parameters associated with the laser without an external storage medium such as a CD (compact laser disc).

Consistent with another embodiment, a laser package may include a laser package support structure defining a laser package region and a semiconductor laser supported by the laser package support structure and within the laser package region. The semiconductor laser is configured to generate light output in response to electrical input. The laser package may also include a memory device supported by the laser package support structure and within the laser package region. The memory device is configured to store parameter data representing parameters associated with the semiconductor laser. The laser package may further include conductive paths extending from the laser package support structure. The conductive paths include at least one laser input path configured to receive the electrical input to the laser and at least one memory data path configured to carry the parameter data.

Consistent with another embodiment, a laser transmitter may include a laser package with integrated memory and laser drive circuitry coupled to the semiconductor laser in the laser package and configured to provide the electrical input to the semiconductor laser.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A transmitter optical sub-assembly (TOSA) laser package comprising:
    a laser package support structure including a TOSA housing defining a laser package region;
    a semiconductor laser supported by the laser package support structure and enclosed within the TOSA housing, the semiconductor laser being configured to generate light output in response to electrical input;
    a memory device supported by the laser package support structure and enclosed within the TOSA housing such that the memory device is inside the TOSA package, the memory device being configured to store parameter data representing parameters associated with the semiconductor laser; and
    conductive paths extending from the laser package support structure to the exterior of the TOSA package, the conductive paths including at least one laser input path configured to receive the electrical input to the laser and at least one memory data path configured to carry the parameter data.

2. The laser package of claim 1 wherein the semiconductor laser is tunable, and wherein the conductive paths include wavelength tuning control paths.

3. The laser package of claim 1 wherein the laser package support structure includes an optical fiber coupling portion configured to couple to an optical fiber to the laser package such that the light output of the semiconductor is coupled into the optical fiber.

4. The laser package of claim 1 further comprising leads coupled to the conductive paths and extending from the laser package support structure.

5. The laser package of claim 1 wherein the laser package support structure includes at least one laser package submount, and wherein the semiconductor laser and the memory device are mounted on the at least one laser package submount.

6. The laser package of claim 1 wherein the memory device is an integrated circuit memory device.

7. The laser package of claim 1 wherein the memory device is configured for serial data communication.

8. The laser package of claim 1 wherein the memory device is configured for serial data communication using two lines including a serial data (SDA) line and a serial clock (SCL) line.

9. The laser package of claim 1 wherein the memory device is configured for serial data communication using an $I^2C$ protocol.

10. The laser package of claim 1 wherein the laser package is an integrated circuit including both the semiconductor laser and the memory device.

11. The laser package of claim 1 wherein the memory device includes at least operational parameter data stored thereon.

12. The laser package of claim 11 wherein the semiconductor laser is tunable, and wherein the operational parameter data represents tuning parameters associated with the semiconductor laser.

13. The laser package of claim 11 wherein the operational parameter data represents at least one operational parameter selected from the group consisting of an output light intensity as a function of a drive current, a slope efficiency as a function of a drive current, a threshold current as a function of temperature, a wavelength as a function of a drive current, and a wavelength as a function of temperature.

14. The laser package of claim 1 wherein said memory device includes at least manufacturing parameter data stored thereon.

15. The laser package of claim 14 wherein the manufacturing parameter data represents at least one manufacturing parameter selected from the group consisting of emission wavelength, part number, lot number, date of manufacture, and operating temperature range.

16. The laser package of claim 1 wherein the memory device is configured to store at least user parameter data.

17. The laser package of claim 16 wherein the user parameter data represents at least one user parameter selected from the group consisting of an output light intensity as a function of a drive current, a slope efficiency as a function of a drive current, a threshold current as a function of temperature, a wavelength as a function of a drive current, and a wavelength as a function of temperature.

18. A laser transmitter comprising:
    a transmitter optical sub-assembly (TOSA) laser package comprising:
        a laser package support structure including a TOSA housing defining a laser package region;

a semiconductor laser supported by the laser package support structure and enclosed within the TOSA housing, the semiconductor laser being configured to generate light output in response to electrical input;

a memory device supported by the laser package support structure and enclosed within the TOSA housing such that the memory device is inside the TOSA package, the memory device being configured to store parameter data representing parameters associated with the semiconductor laser; and conductive paths extending from the laser package support structure, the conductive paths including at least one laser input path configured to receive the electrical input to the laser and at least one memory data path configured to carry the parameter data representing; and laser drive circuitry coupled to the semiconductor laser and configured to provide the electrical input to the semiconductor laser, wherein the laser drive circuitry is located outside of the TOSA housing.

19. The laser transmitter of claim 18 wherein the laser drive circuitry is configured to communicate with at least the memory device to receive the parameter data from the memory device.

20. The laser transmitter of claim 18 wherein the semiconductor laser is tunable.

21. The laser transmitter of claim 19 wherein the memory device is configured to store operational parameter data representing tuning parameters associated with the semiconductor laser.

* * * * *